United States Patent
Deguet et al.

(10) Patent No.: US 9,106,199 B2
(45) Date of Patent: Aug. 11, 2015

(54) ACOUSTIC WAVE DEVICE INCLUDING A SURFACE WAVE FILTER AND A BULK WAVE FILTER, AND METHOD FOR MAKING SAME

(75) Inventors: Chrystel Deguet, Saint Ismier (FR); Laurent Clavelier, Grenoble (FR); Emmanuel Defay, Voreppe (FR); Alexandre Reinhardt, Saint Martin d'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 410 days.

(21) Appl. No.: 13/500,614

(22) PCT Filed: Oct. 4, 2010

(86) PCT No.: PCT/EP2010/064741
§ 371 (c)(1),
(2), (4) Date: Apr. 5, 2012

(87) PCT Pub. No.: WO2011/042388
PCT Pub. Date: Apr. 14, 2011

(65) Prior Publication Data
US 2012/0206216 A1    Aug. 16, 2012

(30) Foreign Application Priority Data
Oct. 9, 2009   (FR) .................... 09 04845

(51) Int. Cl.
*H03H 3/08*   (2006.01)
*H03H 3/02*   (2006.01)
*H03H 3/007*  (2006.01)

(52) U.S. Cl.
CPC . *H03H 3/08* (2013.01); *H03H 3/02* (2013.01); *H03H 2003/0071* (2013.01); *Y10T 29/42* (2015.01)

(58) Field of Classification Search
CPC ........... H03H 3/02; H03H 3/08; H03H 9/205; H03H 2003/0071; Y10T 29/42
USPC ......... 333/133, 189, 193, 194, 195, 196, 186, 333/187, 188; 310/313 B, 313 D; 29/25.35
See application file for complete search history.

(56) References Cited

U.S. PATENT DOCUMENTS

| 6,424,238 B1 | 7/2002 | Penunuri |
| 7,429,905 B2 * | 9/2008 | Shibahara ..................... 333/193 |

(Continued)

FOREIGN PATENT DOCUMENTS

EP    1764918 A1    3/2007

OTHER PUBLICATIONS

J-S Moulet et al.: "High piezoelectric properties in LiNbO3 transferred layer by the Smart Cut (TM) technology for ultra wide band BAW filter applications," IEDM 2008. IEEE International Electron Devices Meeting. Technical Digest IEEE Piscataway, NJ, USA, International Electron Devices Meeting. IEDM Technical Digest, Dec. 15, 2008, pp. 1-4.

(Continued)

*Primary Examiner* — Benny Lee
*Assistant Examiner* — Jorge Salazar, Jr.
(74) *Attorney, Agent, or Firm* — Baker & Hostetler LLP

(57) ABSTRACT

An acoustic wave device comprising at least one surface acoustic wave filter and one bulk acoustic wave filter, the device including, on a substrate comprising a second piezoelectric material: a stack of layers including a first metal layer and a layer of a first monocrystalline piezoelectric material, wherein the stack of layers is partially etched so as to define a first area in which the first and second piezoelectric materials are present and a second area in which the first piezoelectric material is absent; a second metallization at the first area for defining the bulk acoustic wave filter integrating the first piezoelectric material, and a third metallization at the second area for defining the surface acoustic wave filter integrating the second piezoelectric material.

24 Claims, 5 Drawing Sheets

(56) References Cited

U.S. PATENT DOCUMENTS

| | | | |
|---|---|---|---|
| 2006/0238078 | A1* | 10/2006 | Liu .......................... 310/338 |
| 2007/0057772 | A1 | 3/2007 | Liu |
| 2008/0024245 | A1 | 1/2008 | Nam et al. |
| 2008/0284451 | A1 | 11/2008 | Binder et al. |
| 2010/0327995 | A1 | 12/2010 | Reinhardt et al. |
| 2011/0061215 | A1 | 3/2011 | Defay et al. |
| 2011/0080069 | A1 | 4/2011 | Cueff et al. |
| 2011/0273243 | A1 | 11/2011 | Domingue et al. |
| 2012/0007666 | A1 | 1/2012 | David et al. |
| 2012/0056299 | A1 | 3/2012 | Defay et al. |
| 2012/0145667 | A1 | 6/2012 | Imbert et al. |

OTHER PUBLICATIONS

K.M. Lakin et al.: "UHF Composite Bulk Wave Resonators," 1980 IEEE Ultrasonics Symposium Proceedings, pp. 834-837.

R. Aigner: "Bringing BAW Technology into Volume Production: The Ten Commandments and the Seven Deadly Sins," Proceedings of the third international symposium on acoustic wave devices for future mobile communication systems (2007).

J. Kaitila: "Review of Wave Propagation in BAW Thin Film Devices Progress and Prospects," Proceedings of the 2007 IEEE Ultrasonics Symposium, pp. 120-129.

P. Muralt et al.: "Is there a better material for thin film BAW applications than AIN?", Proceedings of the 2005 IEEE Ultrasonics Symposium, pp. 315-320.

D. Gachon et al.: High Overtone Bulk Acoustic Resonators Based on Thinned Single-crystal Piezoelectric Layers: Filters and Frequency Sources Applications, Acoustics 2008 European Frequency and Time Forum, 1348.

D. Gachon et al.: High Overtone Bulk Acoustic Resonators Based on Thinning Single-crystal Piezoelectric Layers, Proceedings of the 2007 IEEE Ultrasonics Symposium, pp. 1143-1146.

H.L. Salvo, Jr. et al.: Shear Mode Transducers for High Q Bulk Microwave Resonators, Proceedings of the 41st Annual Frequency Control Symposium (1987), pp. 388-390.

J.S. Wang et al.: "Sputtered C-AXIS Inclined Piezoelectric Films and Shear Wave Resonators," Proceedings of the 37th Annual Frequency Control Symposium (1983), pp. 144-150.

N. Lobo et al.: Novel Dual Mode SAW-BAW Device, 2006 IEEE Ultrasonics Symposium, pp. 2397-2400.

N. Bruel: "Silicon on Insulator material technology," Electronics Letters, Jul. 6, 1995, vol. 31, No. 14, pp. 1201-1202.

L. Di Cioccio et al.: "Silicon carbide on insulator formation by the Smart-Cut process," Materials Science and Engineering, vol. B46, pp. 349-356 (1997).

E. Jalaguier et al.: "Transfer of 3in GaAs film on silicon substrate by proton implantation process," Electronics Letters, Feb. 19, 1998, vol. 34, No. 4, pp. 408-409.

E. Jalaguier et al.: "Transfer of thin InP films onto silicon substrate by proton implantation process," IEEE Proceedings 11th International Conference on Indium Phosphide and Related Materials, May 1999, pp. 26-27.

A. Tauzin et al.: "Transfers of 2-inch GaN films onto sapphire substrates using Smart Cut™ technology," Electronics Letters, May 26, 2005, vol. 41, No. 11, pp. 668-670.

C. Deguet et al.: "200 MM Germanium-On-Insulator (GEOI) Structures Realized From Epitaxial Wafers Using the Smart Cut™ Technology," Electrochemical Society Proceedings, vol. 2005-2006, pp. 78-88.

Y.B. Park et al.: "Integration of Single-Crystal LiNbO3 Thin Film on Silicon by Laser Irradiation and Ion Implantation-Induced Layer Transfer," Advanced Materials, vol. 18, (2006), pp. 1533-1536.

I. Radu et al.: "Ferroelectric Oxide Single-Crystalline Layers by Wafer Bonding and Hydrogen/Helium Implantation," Material Research Society Symposium Proceedings, vol. 748 (2003).

Q. Wan et al.: "Investigation of H+ and B+/H+ implantation in LiTaO3 single-crystals," Nuclear Instruments and Methods in Physics Research, vol. B, No. 184 (2001), pp. 531-535.

* cited by examiner

ACOUSTIC WAVE DEVICE INCLUDING A SURFACE WAVE FILTER AND A BULK WAVE FILTER, AND METHOD FOR MAKING SAME

CROSS-REFERENCE TO RELATED APPLICATIONS

This application is a National Stage of International patent application PCT/EP2010/064741, filed on Oct. 4, 2010, which claims priority to foreign French patent application No. FR 09 04845, filed on Oct. 9, 2009, the disclosures of each of which are incorporated by reference in their entireties.

FIELD OF THE DISCLOSED SUBJECT MATTER

The field of the invention is that of band filters and, more specifically, that of acoustic wave filters.

BACKGROUND

The development of radiofrequency telecommunications over the last ten or so years has been reflected in congestion of the authorized frequency bands. To exploit the available frequency bands, the systems have to include a band filtering means with a narrow transition band. Only the resonator filters in SAW (surface wave) or BAW (bulk wave) technology, using the piezoelectric properties of the materials, can satisfy these specifications with low losses and a reduced congestion. These days, the piezoelectric layers used for these filters are produced by deposition which makes it possible to design bulk acoustic wave filters (BAW filters) or from bulk substrates that make it possible to design surface acoustic wave filters (SAW filters).

The specifications demanded by the professionals in telecommunications equipment are increasingly difficult in terms of out-band rejection and transition stiffness, without in any way being relaxed with regard to the other parameters (insertion losses, in-band variations, etc.). The only way to give back a little design latitude consists in significantly reducing the frequency variations due to temperature.

It will be recalled, by way of indication, that the variation of the resonance frequency of a resonator on quartz is determined by the following formula:

$$f(T) = f_0[1 + CTF_1(T-T_0) + CTF_2(T-T_0)^2 + \ldots]$$

with $f_0$ being the frequency at $T_0$, $T_0$ being the reference temperature (25° C. by convention), $CTF_1$ being the first order coefficient expressed in ppm/° C. and $CTF_2$ being the second order coefficient expressed in ppb/° C.$^2$.

For CTF1, by changing, for example, from 35 ppm/° C. to 20 ppm/° C. or less, it is possible to improve the performance levels significantly and thus the competitiveness of the products.

FIG. 1a schematically represents an SAW filter structure: on a bulk piezoelectric substrate $S_{piezo,s}$, surface metallizations, which can typically be of interdigital electrode comb type $M_{s1}$ and $M_{s2}$, ensure the excitation of the piezoelectric material allowing for the propagation of surface acoustic waves.

The surface wave filters are still currently the standard solution for synthesizing and producing RF filters in the 50 MHz-3 GHz range given their robustness, their technological ease of implementation and the multitude of accessible filter structures, offering the designer a true design strategy based on the specifications imposed.

For example, and although affected by thermal drifts, the filters on tantalate and lithium niobate make it possible to produce relative bandwidths greater than those of the bulk wave filters by virtue of their high coupling coefficients (more than 10%) and their quality factor Q. Thus, it is possible to obtain products $Q \times f_{max}$ of the surface waves close to $10^{13}$ whereas those obtained with the bulk waves on thin films remain around $4 \times 10^{12}$.

FIG. 1b schematically represents a bulk wave filter structure: a piezoelectric substrate $S_{piezo,v}$ is inserted between two metallizations $M_1$ and $M_2$ allowing for the propagation of bulk waves.

The bulk wave filters were proposed approximately thirty years ago, with frequencies of from a few MHz to a few tens of MHz, mainly using impedance elements or lateral coupling structures on quartz for narrow band applications, but their implementation for radio frequencies dates back only ten or so years, following the pioneering works of Lakin (K. M. Lakin and J. S. Wang, *UHF composite bulk wave resonators*, 1980 IEEE Ultrasonics Symposium Proceedings, pages 834-837) concerning the use of piezoelectric layers deposited by cathodic sputtering for such purposes.

The company Agilent was the first to develop an RF filter of FBAR (film bulk acoustic resonator) filter type based on impedance elements exploiting thin films of aluminium nitride (AlN), a deposited polycrystalline material.

The BAW resonators exploit the thickness resonance of a thin piezoelectric layer which is acoustically insulated from the substrate either by a membrane (FBAR technology used by the company AVAGO Technologies), or by a Bragg array (SMR technology used by the company Infineon).

The material most widely used in BAW technology is currently aluminium nitride (AlN), which offers the advantage of exhibiting piezoelectric coupling coefficients of the order of 6.5%, and also of exhibiting low acoustic and dielectric losses, which allows for the synthesis of filters exhibiting passbands compatible with the specifications demanded by most of the telecommunication standards located between 2 and 4 GHz.

However, a number of problems continue to arise, faced with the extremely restrictive specifications presented by a few frequency bands, such as the Digital Cellular Service ("DCS") standard.

The piezoelectric coupling coefficients permitted by AlN do not allow relative passbands greater than 3%. Such bandwidths already require the use of electrodes having a very strong acoustic impedance (made of molybdenum or of tungsten), so as to contain the elastic energy in the piezoelectric layer, and thicknesses that are carefully determined so as to maximize their influence on the piezoelectric coupling coefficient of the resonators as described in the paper by R. Aigner, "Bringing BAW technology into volume production: the Ten Commandments and the seven deadly sins", Proceedings of the third international symposium on acoustic wave devices for future mobile communication systems (2007) and in the publication by J. Kaitila, "Review of wave propagation in BAW thin film devices: progress and prospects", Proceedings of the 2007 IEEE Ultrasonics Symposium.

There are currently no credible solutions for extending this band in relation to constant losses. Numerous research efforts are currently being conducted to find other materials exhibiting higher piezoelectric coupling coefficients, but it has to be stated that it is difficult to uncover other materials offering low acoustic losses and that can be deposited reproducibly and uniformly as described in the paper by P. Muralt et al., "Is there a better material for thin film BAW applications than AlN", Proceedings of the 2005 IEEE Ultrasonics Symposium.

Conversely, monocrystalline materials such as lithium niobate or lithium tantalate offer very high electromechanical coupling coefficients, making it possible to produce filters exhibiting relative bandwidths of the order of 50% but they remain complex to implement.

Moreover, standards such as DCS require both a wide passband and a strong rejection of the adjacent standards. To simultaneously address all these constraints entails using resonators that have very strong quality coefficients.

Because of this, the limits imposed by the materials themselves, more than by the structure, are beginning to be profiled, and it is highly probable that polycrystalline materials can no longer ultimately meet the rise in quality coefficients, especially given the rise in frequency of the standards toward 10 GHz. With intrinsic quality coefficients of the order of ten or so thousand at frequencies greater than 1 GHz as described in the paper by D. Gachon et al., "Filters using high overtone bulk acoustic resonators on thinned single-crystal piezoelectric layer", submitted at the 2008 European Frequency and Time Forum, the monocrystalline materials standout here also as an interesting solution.

The BAW resonators based on aluminium nitride AlN use a longitudinal vibration mode capable of generating an acoustic radiation in the air, which is a source of additional acoustic losses. Furthermore, the volume changes associated with the compression mode result in increased acoustic losses inside the material, notably described in H. L. Salvo et al., "Shear mode transducers for high Q bulk microwave resonators", Proceedings of the $41^{st}$ Annual Frequency Control Symposium (1987).

One means of reducing the two sources of losses is to exploit shear waves, which requires the use of materials other than AlN, or the crystalline orientation of deposited AlN layers to be modified.

Studies are being focused on the deposition of AlN layers with a crystallographic axis c in the plane of the substrate, or with an angle of 35° relative to the normal, but the quality of the material obtained has proven less good than in the case of a vertical axis c as demonstrated by the authors J. S. Wang et al., "Sputtered c-axis piezoelectric films and shear wave resonators", Proceedings of the 37th Annual Frequency Control Symposium (1983).

It emerges from this prior art that, in general, each type of filter offers advantages and drawbacks. For example, the SAW filters are known for having strong coupling coefficients allowing for a higher rejection rate. The BAW filters are used more for their low insertion losses and their more effective temperature compensation than on SAWs.

Thus, it may be advantageous to produce a filter combining SAW filter and BAW filter to derive benefit from each system. Then comes the problem of packaging, to integrate an SAW filter and a BAW filter in the same system, with all the issues of space, weight and therefore associated cost and of optimizing the performance levels of each of the filters.

It has already been proposed to co-integrate a surface acoustic wave (SAW) filter and a bulk acoustic wave (BAW) filter in one and the same device, the SAW/BAW co-integration being done in the packaging by arranging side by side BAW and SAW filters obtained from two or more distinct fabrication lines.

With respect to the co-integration on one and the same substrate, it has been proposed, in the article by N. Lobo, D. C. Malocha: School of Electrical Engineering and Computer Science University of Central Florida, Orlando, Fla., 1051-0117/06, 2006 IEEE, Ultrasonics Symposium, to use common electrodes for the production of the SAW filter and for that of the BAW filter, the optimizations of said two filters not being able, by the same token, to be produced independently of one another.

There has also been proposed, in the U.S. Pat. No. 6,424,238 or in the patent application US 2007/0057772, a co-integration by approaches involving packaging two coupled but not very compact chips.

A different approach, described in the patent application US 2008/0284541, proposes the fabrication of a substrate for the production of a BAW. This patent application mentions the integration of other components (of LED, HEMT, and other such types). However, the same active layer is used for all of the components, which does not allow for the independent optimization of each of the filters, respectively SAW and BAW in the case in point.

It has also, finally, been proposed to co-integrate a BAW and a SAW on one and the same substrate with, for each of these filters, a distinct piezoelectric material according to the patent application US 2008/024245.

SUMMARY

In this context, the applicant proposes, in the present invention, producing a structure also comprising the co-integration of a BAW and a SAW, said BAW being produced from a monocrystalline piezoelectric material, and to do so in order to obtain a better intrinsic quality coefficient and using specific preparation methods.

More specifically, the subject of the present invention is an acoustic wave device comprising at least one surface acoustic wave filter and one bulk acoustic wave filter, characterized in that it comprises, on a substrate comprising a second piezoelectric material:

a stack of layers comprising at least one first metal layer and a layer of a first monocrystalline piezoelectric material;

the stack of layers being partially etched so as to define a first area in which the first and second piezoelectric materials are present and a second area in which the first piezoelectric material is absent;

a second metallization in the first area to define the bulk acoustic wave filter incorporating the first piezoelectric material and a third metallization in the second area to define the surface acoustic wave filter incorporating the second piezoelectric material.

According to a variant of the invention, the substrate is made of a second piezoelectric material.

According to a variant of the invention, the substrate comprises a layer of second piezoelectric material.

According to a variant of the invention, the second piezoelectric material is of $LiNbO_3$, $LiTaO_3$, $La_3Ga_5SiO_{14}$ (langasite), $La_3Ga_{5.5}Ta_{0.5}O_{14}$ (langatate) type.

According to a variant of the invention, the second piezoelectric material is of $SrTiO_3$ (STO) or $PbZrTiO_3$ (PZT) or AlN or ZnO type.

According to a variant of the invention, the first piezoelectric material is of $LiNbO_3$ (LNO), $LiTaO_3$ (LTO), $La_3Ga_5SiO_{14}$ (langasite), $La_3Ga_{5.5}Ta_{0.5}O_{14}$ (langatate), $SrTiO_3$ (STO), $PbZrTiO_3$ (PZT), AlN, ZnO type.

According to a variant of the invention, the substrate is of sapphire, silicon, quartz, glass type.

According to a variant of the invention, the first metal layer is made of metal of copper (Cu), copper and aluminium alloy (AlCu), tungsten (W), molybdenum (Mo), AlSi, Cr type.

According to a variant of the invention, the device also comprises at least one molecular bonding layer inserted between the first metallization and the second piezoelectric material, of low temperature oxide type of $SiO_2$ type.

According to a variant of the invention, the device also comprises a decoupling layer situated on the layer of second piezoelectric material and under the first metal layer.

According to a variant of the invention, the decoupling layer is a layer of air.

According to a variant of the invention, the decoupling layer comprises a Bragg array structure, said array being able to comprise an alternation of layers of tungsten (W) and of silica ($SiO_2$).

Also the subject of the invention is a method for fabricating an acoustic wave device comprising at least one surface acoustic wave filter and one bulk acoustic wave filter according to the invention, characterized in that it comprises the following steps:

the formation of a stack comprising at least one layer of second piezoelectric material, a first metallization layer ($M_1$) and a layer of a first monocrystalline piezoelectric material, comprising the application of the layer of first piezoelectric material associated with the first metallization layer on the layer of second piezoelectric material;

the partial etching of said stack so as to define a first area in which the first and second piezoelectric materials are present and a second area in which the first piezoelectric material is absent;

the production of a second metallization in the first area to define the bulk acoustic wave filter incorporating the first piezoelectric material and a third metallization in the second area to define the surface acoustic wave filter incorporating the second piezoelectric material.

According to a variant of the invention, the application of the layer of first piezoelectric material associated with the first metallization layer on the layer of second piezoelectric material comprises:

the definition of a thin layer of first piezoelectric material within a substrate of first piezoelectric material comprising a top layer of first metallization defining a first assembly;

the assembly of said first assembly comprising said thin layer of first piezoelectric material defined within a substrate of first piezoelectric material on the first metallization side on the second piezoelectric material;

the separation of said substrate of first piezoelectric material from said thin layer of first piezoelectric material.

According to a variant of the invention, the definition of the thin layer of first piezoelectric material comprises the following steps:

the metallization of a substrate comprising, at least on the surface, the first piezoelectric material;

the implantation of ions in said substrate to create, in the first piezoelectric material, a buried fragile area defining the thin layer of first piezoelectric material.

According to a variant of the invention, the ion implantation is performed with hydrogen ions and/or helium ions.

According to a variant of the invention, the separation is produced by heat treatment.

According to a variant of the invention, the application of the layer of first piezoelectric material associated with the first metallization layer on the layer of second piezoelectric material comprises:

a step of assembling a first substrate comprising at least one layer of first piezoelectric material covered with a top layer of first metallization with a second piezoelectric material and a step of thinning the first substrate by lapping/polishing so as to define a thin layer of first piezoelectric material.

According to a variant of the invention, the assembly is performed by molecular bonding.

According to a variant of the invention, the first assembly comprises a first bonding layer, the second piezoelectric material being covered with a second bonding layer.

According to a variant of the invention, the first assembly comprises a decoupling layer.

According to a variant of the invention, the layer of second piezoelectric material consists of the superficial portion of a bulk substrate of second piezoelectric material.

According to a variant of the invention, the layer of second piezoelectric material ($P_{iezo2}$) is deposited or applied by epitaxy or surface-mounting on a substrate.

BRIEF DESCRIPTION OF THE DRAWINGS

The invention will be better understood, and other advantages will become apparent, from reading the following description, given as a nonlimiting example, and by virtue of the appended figures in which.

DETAILED DESCRIPTION

Figure 1A:
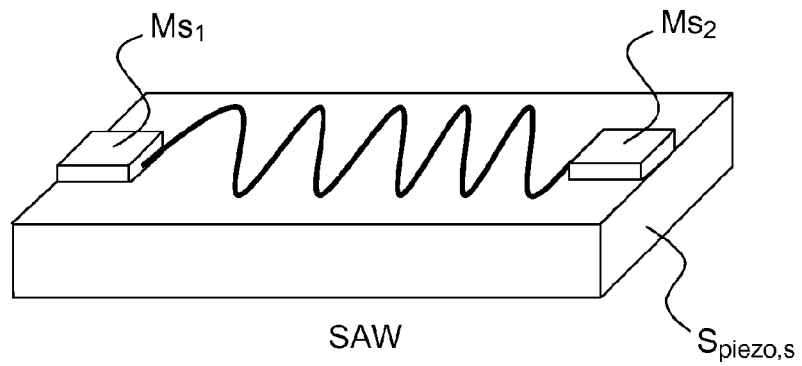
FIGS. 1a and 1b respectively illustrate surface acoustic wave and bulk acoustic wave structures.
Figure 1B:
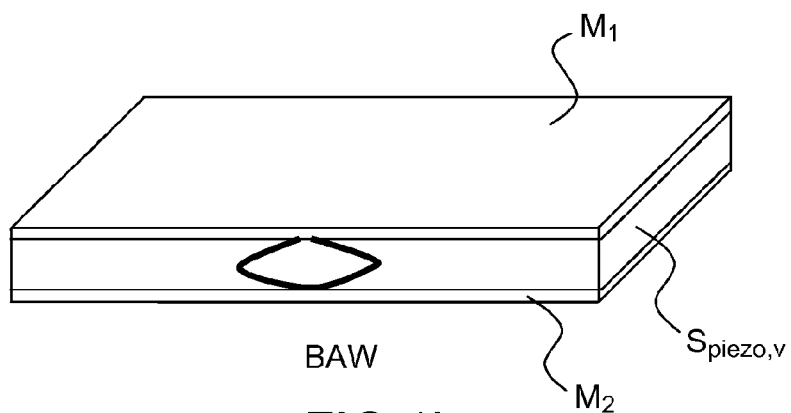
Figure 2:
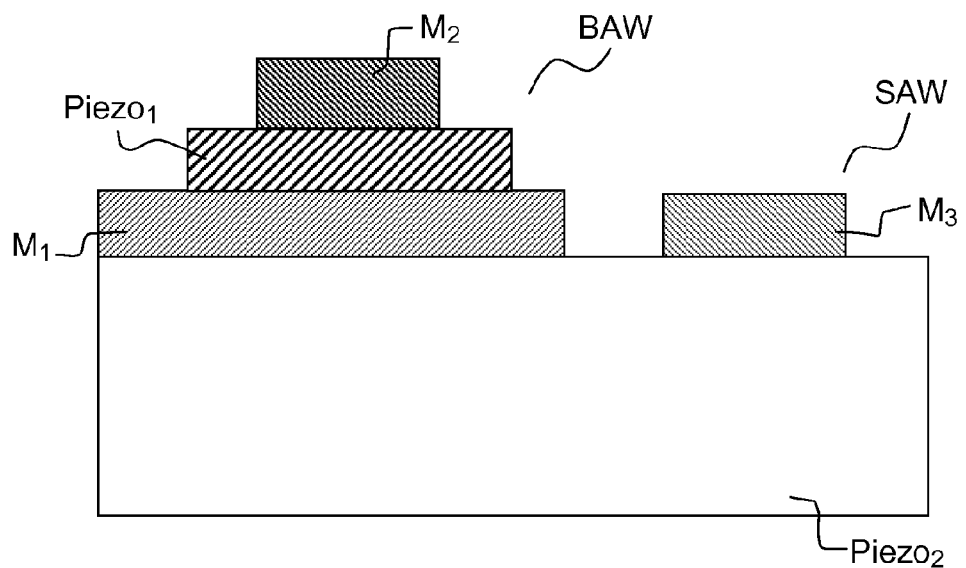
FIG. 2 illustrates an exemplary device according to the invention.

Generally, the device of the invention comprises, as illustrated in FIG. 2, a substrate comprising, at least on the surface, a piezoelectric material.

Advantageously and as described below, the substrate can be the piezoelectric material $P_{iezo2}$ on which is arranged a stack comprising a layer of metal $M_1$, a layer of piezoelectric material $P_{iezo1}$ and a layer of metal $M_2$, thus defining a first area in which the bulk acoustic wave filter of BAW type is produced. Advantageously, an acoustic decoupling layer is provided between the second piezoelectric material and the layer of metal $M_1$ to decouple the two piezoelectric layers.

The substrate $P_{iezo2}$ also comprises, in a second area, a metallized assembly $M_3$ for defining a set of electrodes on the surface of said piezoelectric material so as to produce the surface acoustic wave filter.

The piezoelectric materials can be of different types: they can be polycrystalline, notably when they are deposited and possibly baked (case of $SrTiO_3$ or $PbZrTiO_3$ or AlN or ZnO), they are advantageously monocrystalline when they are surface-mounted (case of $LiNbO_3$, $LiTaO_3$, $La_3Ga_5SiO_{14}$, $La_3Ga_{5.5}Ta_{0.5}O_{14}$).

A fabrication method that is particularly suited to the fabrication of a device of the invention will be described below.

In order to produce the thin layer of monocrystalline material $P_{iezo1}$ it is advantageously possible to use two types of existing techniques for applying thin layers that make it possible to retain the monocrystalline nature of the starting substrate from which this thin layer is taken: a first technique based on the implantation of gaseous ions (typically hydrogen), called implantation/fracture technique, and a second technique based on mechanical thinning after bonding, called bonding/mechanical thinning technique.

These techniques can be used to apply a monocrystalline layer to a receiving substrate or a host substrate. These techniques are perfectly controlled on silicon allowing, among other things, for the industrial fabrication of SOI (silicon on insulator) wafers. These two techniques are differentiated by the range of material thickness that is to be applied, the bonding/mechanical thinning method being limited to thicknesses of the order of a minimum of a few microns, the implantation/fracture method for its part allowing for very small thicknesses to be achieved, typically possibly less than approximately 0.5 µm but being limited for values greater than 2 µm with a conventional microelectronics implanter and to a few tens of µm with high-energy implanters.

The implantation/fracture application method is notably described in the article: "Silicon on insulator material technology", Electronic letters, 31 (14), p. 1201-1202 (1995), it notably allows for the production of SOI "silicon on insulator" substrates.

Figure 3:
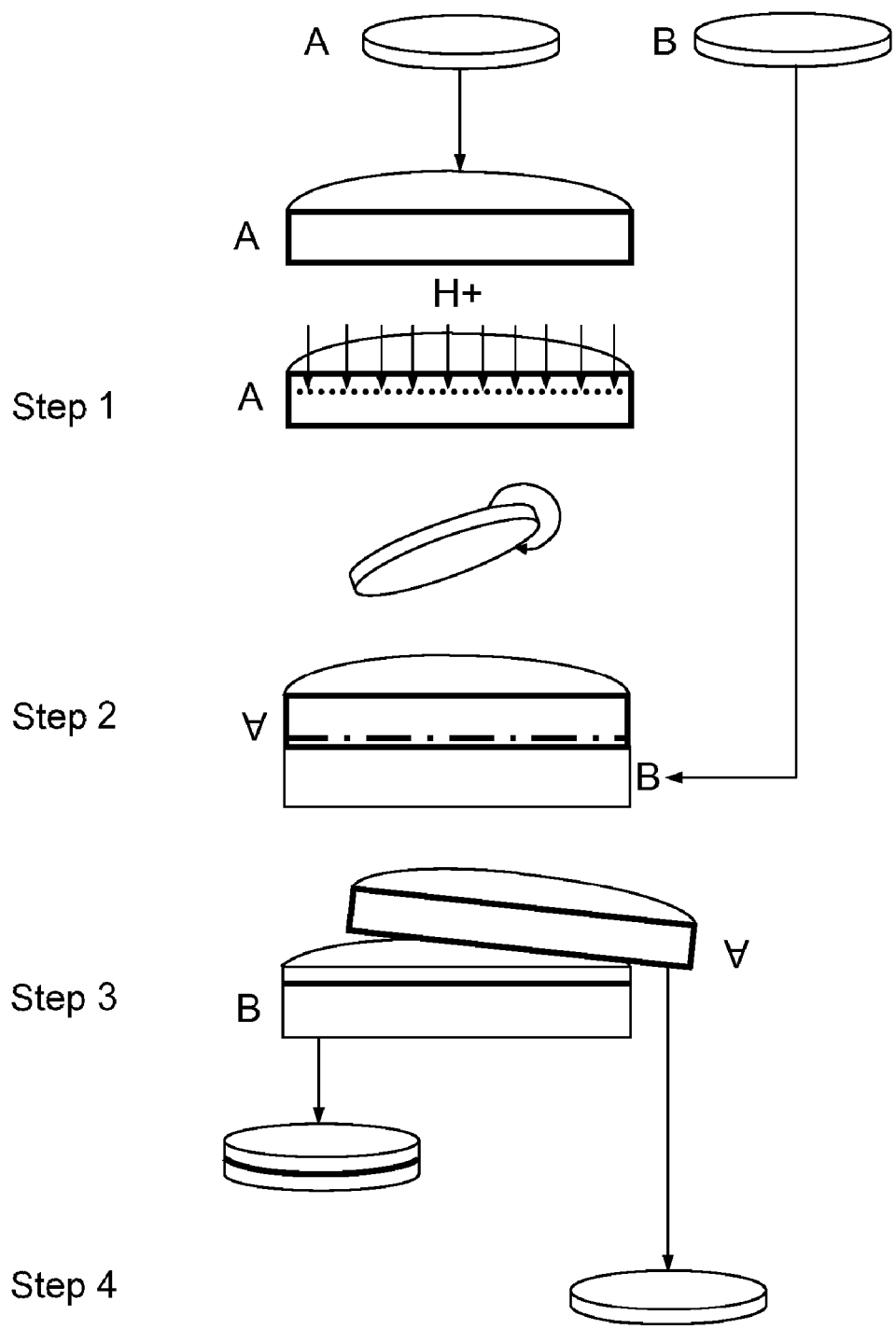
FIG. 3 illustrates the main steps of a method for applying a film based on implantation/fracture.

This method can be schematically summarized by the following four steps illustrated in FIG. 3:

Step 1: A donor substrate A, for example of silicon, is implanted with gaseous species (for example hydrogen and/or rare gases) to form a buried fragile area, delimiting in this substrate the thin film to be transferred.

Step 2: The donor substrate is then assembled at the level of the thin film previously defined, for example by direct bonding (also called molecular bonding), with a receiving substrate B.

Step 3: A fracture step is then obtained at the level of the buried fragile area by means of a heat treatment possibly assisted by the application of mechanical stresses. The result obtained is, on the one hand, the thin film attached to the receiving substrate and, on the other hand, the remainder of the donor substrate corresponding to the initial donor substrate A, with the transferred thin film peeled away. The latter can then be recycled for the production of another transfer.

Step 4: Possibly, final treatments can be carried out, for example a high-temperature bake to consolidate the bonding interface between the transferred thin film and the receiving substrate.

The thickness of the transferred thin film is directly linked to the implantation energy of the ion beam. As an example, the thickness of silicon transferred to go from a few tens of nm to approximately 2 µm by using a conventional implanter (energy<210 KeV).

The transferred layers are uniform and homogeneous in thickness because they are defined by an implantation depth and not by a mechanical thinning.

This is a flexible method which allows, for example, for the production of heterostructures. In addition to silicon, different materials have already been transferred through this technique:

SiC L. DiCioccio, F. Letertre, Y. Le Tiec, A. M. Papon, C. Jaussaud and M. Bruel: "*Silicon carbide on insulator formation by Smart Cut™ process*", Master. Sci. Eng., vol. B46, pp. 349-356 (1997);

GaAs: E. Jalaguier, B. Aspar, S. Pocas, J. F. Michaud, M. Zussy, A. M. Papon and M. Bruel: "Transfer of thin GaAs film on silicon substrate by proton implantation process", Electronic letters, vol. 34, No. 4, pp. 408-409 (1998);

InP: E. Jalaguier, B. Aspar, S. Pocas, J. F. Michaud, A. M. Papon and M. Bruel: "Transfer of thin InP film onto silicon substrate by proton implantation process", IEEE Proc. 11$^{th}$ International Conference on Indium Phosphide and Related Materials, Davos (Switzerland) (1999);

GaN: A. Tauzin, T. Akatsu, M. Rabarot, J. Dechamp: "Transfers of 2-inch GaN films onto sapphire substrates using Smart Cut™ technology", Electronics Letters 26 May 2005 vol. 41 No. 11;

or Ge: C. Deguet et al—200 mm Germanium-On-Insulator (GeOI) structures realized from epitaxial Germanium wafers by the Smart Cut™ technology—Electro Chemical Society 2005.

These transfers can be produced on different receiving substrates: quartz, Si, Ge, GaAs, sapphire, etc.

Such a method therefore makes it possible to propose, without greatly disturbing the technology, the integration of electrodes or Bragg filters, which are particularly suited to the issues addressed by the present invention. In practice, these days in most components for the MEMS microsystems, the layers of piezoelectric materials are produced by deposition techniques of PVD or sol gel type. Generally, the layers to be created for these components are within a range of thicknesses between a few hundreds of nm and a micron. This is why the control of the fabrication of piezoelectric and monocrystalline electrostrictive layers for this range of thicknesses constitutes a significant technological obstacle.

Studies have shown the possibility of transferring piezoelectric layers by implantation/fracture. Reference can notably be made to the publication: Integration of single-crystal LiNbO$_3$ thin film on silicon by laser irradiation and ion implantation-induced layer transfer, Y. B. Park, B. Min, J. Vahala and H. A. Atwater, Advanced Materials, vol. 18 (2006) 1533. These authors demonstrate the production of a transfer of 800 nm of LiNbO$_3$ by co-implantation of H ions at 80 keV with a dose of 5e16 ions/cm$^2$ and a helium energy of 115 keV with a dose of 1e17 ions/cm$^2$. The originality of this publication lies in the transfer mechanism which is done using a cw-CO$_2$ (100 MW·m$^{-2}$) laser used as heat source for this purpose.

A study conducted by M. Alexe: "Ferroelectric oxide single-crystalline layers by wafer bonding and Hydrogen/Helium implantation," I. Radu, I. Szafraniak, R. Scholz, M. Alexe, U. Gösele, Mat. Res. Soc. Symp. Proc., vol. 748 (2003) addresses the issue of finding the optimal blistering conditions (determinant conditions for a transfer by implantation/fracture) for different materials, such as LiNbO$_3$, LaAlO$_3$, SrTiO$_3$, or even PbZrTiO$_3$, by using helium and hydrogen ions. Similar studies have been conducted in LiTaO$_3$: "Investigation of H+ and B+/H+ implantation in LiTaO3 single crystals" Nuclear Instruments and Methods in Physics Research, B 184 (2001) p. 53, using H+ implantation and B+/H+ co-implantation, these authors focusing essentially on characterizing the damage created by the implantation and the effect of the recovery bakes.

Finally, the applicant has herself proposed solutions for transferring LiNbO3 according to the implantation/fracture technology: J-S. Moulet and al; "High piezoelectric properties in LiNbO3 transferred layer by the Smart Cut technology for ultra wide band BAW filter application," IEDM 2008-IEEE-International-Electron-Devices-Meeting.-Technical-Digest. 2008.

This is why a method of the invention that is particularly suited to the device design of the invention proposes coupling the advantage of producing SAW and BAW filters on piezoelectric materials in monocrystalline thin layer with that of being able to produce on the same substrate an SAW component and a BAW component by a technology for applying monocrystalline thin layers (notably by implantation/fracture), by the same token allowing more latitude as to the choice of the crystalline orientation and to the independent optimization of each type of component.

FIGS. 4a to 4h thus illustrate the different steps of such a method.

Figure 4A:
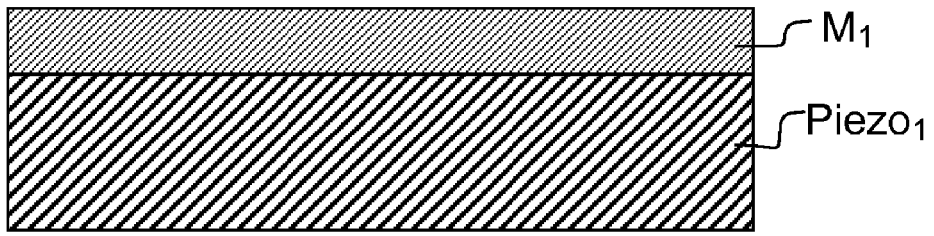
FIGS. 4a to 4h illustrate the different steps of an exemplary method for fabricating a device according to the invention.

A metal layer $M_1$ is deposited on a substrate of first piezoelectric material $P_{iezo1}$, as illustrated in FIG. 4a.

Figure 4B:
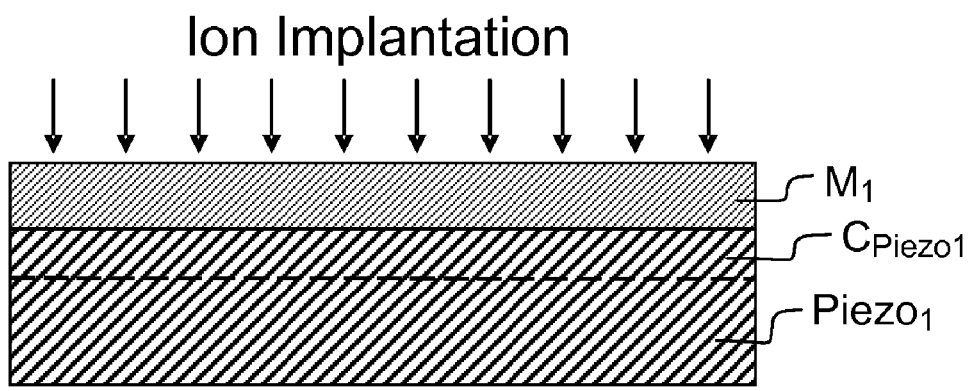

An ion implantation operation is then carried out, for example based on H+, He or a mixture of the two types depending on the nature of the piezoelectric material with doses of between $1\times10^{16}$ and $1\times10^{17}$ at/cm², and with an energy of between 50 keV and 240 keV depending on the thickness to be transferred, as illustrated in FIG. 4b, to create a buried fragile area for defining the piezoelectric thin layer to be transferred $C_{piezo1}$ within the piezoelectric substrate $P_{iezo1}$. It will be noted that, if the heat conditions permit, the implantation can be carried out before the deposition of the metal layer $M_1$.

Figure 4C:
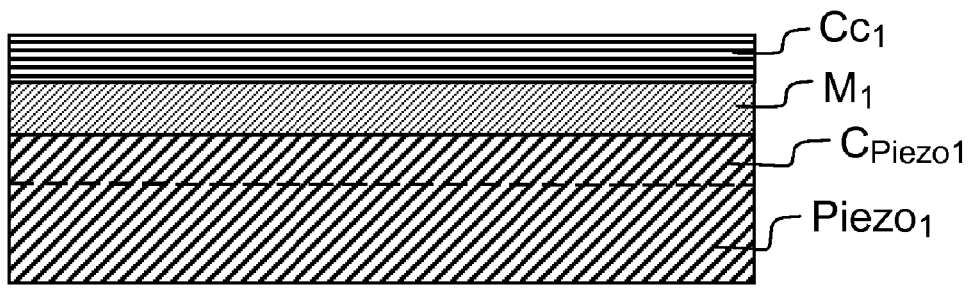

Advantageously, a bonding layer $C_{c1}$ of a few tens or even hundreds of nm is then deposited on top of the metal layer as illustrated in FIG. 4c, for example a low temperature silicon oxide is used (deposited, for example, by ion beam sputtering) which is sufficiently dense not to require densification. This layer is then prepared to be compatible with a direct bonding operation, for example by a preparation by polishing (of CMP type: mechanical-chemical polishing with slurry based on colloidal silica) which makes it possible to obtain the roughness and the chemical activation of the surface that are desired for the direct bonding.

Figure 4D:
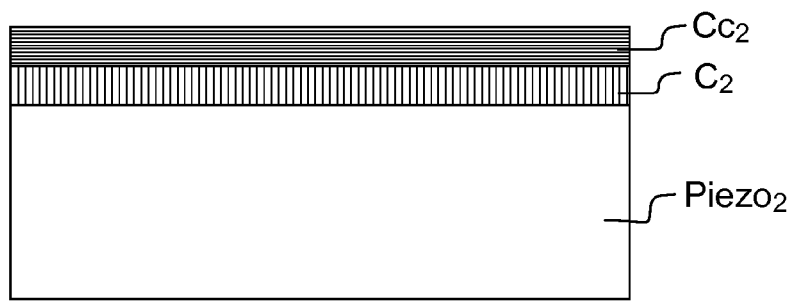

In parallel, from a substrate of second piezoelectric material $P_{iezo2}$, bulk monocrystalline, the deposition of an intermediate layer $C_2$ is advantageously produced (which can serve as acoustic decoupling layer either directly if it is a Bragg array, or after elimination, the air replacing the eliminated layer then being used for the actual decoupling), and the deposition of a bonding layer $C_{c2}$ suited to a subsequent molecular bonding operation, as illustrated in FIG. 4d. More specifically, a bulk piezoelectric substrate (for example of LiNbO3, LiTaO3, etc. type) is chosen for the SAW application (in terms of orientation, of nature of material, etc.).

The layer $C_2$ may comprise, for example, a sacrificial layer, or else a Bragg array (alternating layers of W/SiO2 of a few hundreds of nm), with a layer for example of $SiO_2$ on the surface intended to be used later for the bonding and serving as bonding layer Cc2. Similarly, the bonding layer Cc1 may be an integral part of the Bragg array ultimately arranged between the second piezoelectric material and the first metal layer M1.

The layers Cc1 and Cc2 can also have a role in the compensation of the temperature variation of the piezoelectric material when the SAW is compensated. Additional layers can also be provided to ensure this compensation.

Figure 4E:
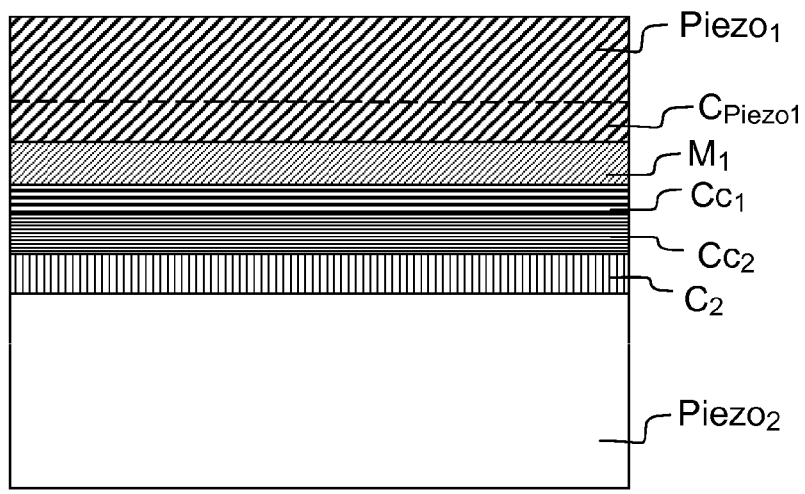

The two substrates are then bonded by molecular bonding as illustrated in FIG. 4e.

Figure 4F:
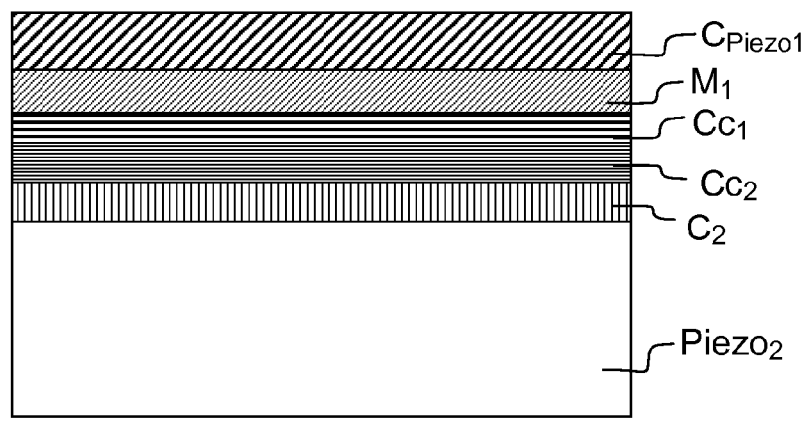

A heat treatment is then applied (between 100° C. and 500° C., preferably 250° C.) in order to initiate the transfer of the thin film of first material $P_{iezo1}$ as illustrated piezoelectric layer in FIG. 4f and that makes it possible to separate the thin c aye be transferred $C_{piezo1}$ from the rest of the substrate of first piezoelectric material.

Finishing methods that are not represented (such as heat treatment and/or polishing to obtain a roughness compatible with the subsequent production of components) can be applied.

Figure 4G:
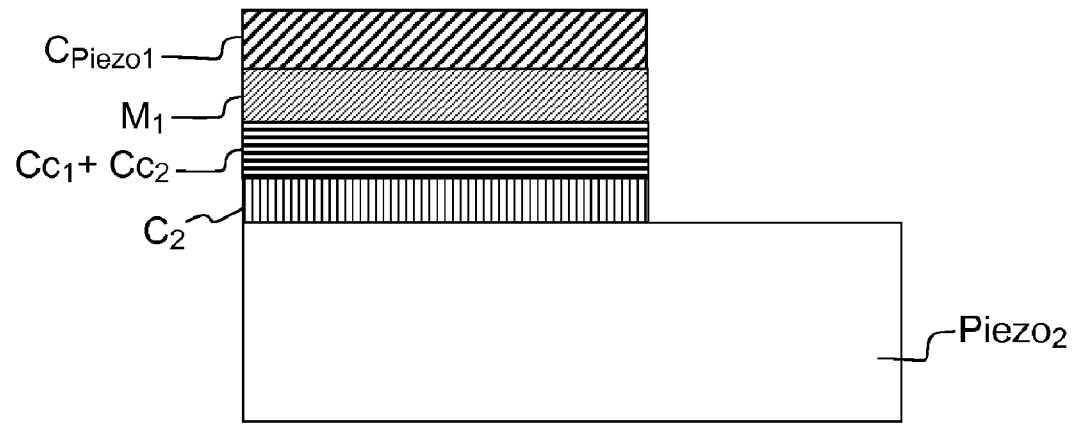

A part of the stack produced in this way is then etched so as to define two areas respectively dedicated to the formation of a bulk acoustic wave filter and to the formation of a surface acoustic wave filter, as illustrated in FIG. 4g.

More specifically, the top layers are etched for example by dry etching, to expose the layer of material $P_{iezo2}$ so as to be able to produce and optimize the two components independently of one another (in terms of design/material of the electrodes, etc.).

Figure 4H:
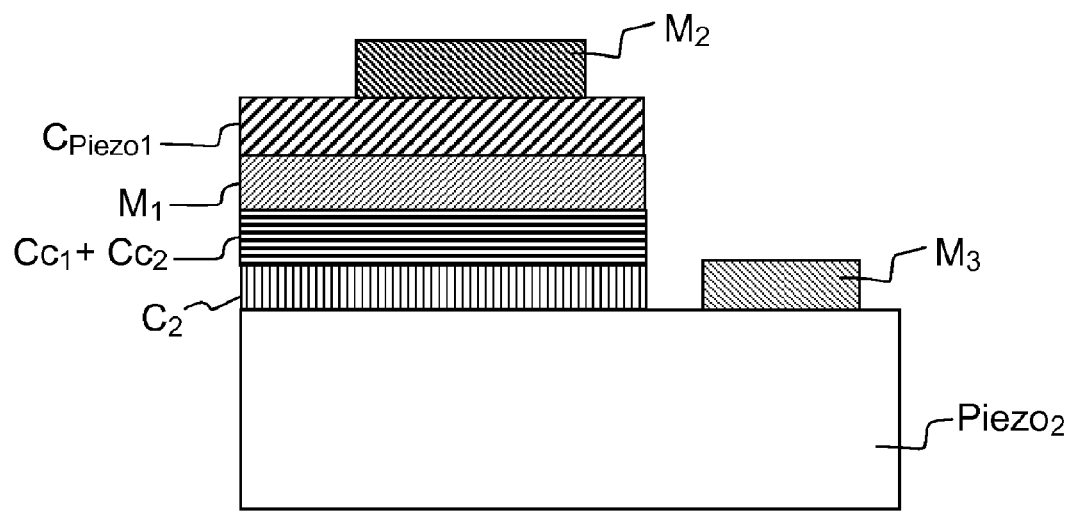

The production of the metallization $M_2$, corresponding to the top electrode of the BAW-type filter, the bottom electrode consisting of the metallization $M_1$, is then carried out as illustrated in FIG. 4h. The production of the metallization $M_3$ on the surface of the material $P_{iezo2}$, in which electrodes necessary to the design of the SAW filter are "designed", is then also carried out, as illustrated in FIG. 3.

It is possible at this stage, if a sacrificial decoupling layer has been provided, to eliminate it, for example by selective etching to leave, between the layer of second piezoelectric material and the metallization layer $M_1$, air ensuring the acoustic decoupling between the two piezoelectric layers.

Different alternatives to the method described previously can be envisaged:

In practice, an alternative approach for obtaining the transfer operation, can consist in assembling the two substrates, for example by direct bonding, then in thinning the substrate of first piezoelectric material $P_{iezo1}$ by a lapping/polishing step. The thicknesses of material obtained in this case are generally greater than a few μm.

According to another variant, the bulk substrate of material $P_{iezo2}$ can be replaced with a composite substrate composed of a host substrate (for example a suitable material for the temperature compensation of sapphire, silicon, quartz or similar type) onto which is transferred (by implantation/fracture or bonding/mechanical thinning) or deposited or applied by epitaxy, a piezoelectric layer. AlN epitaxy on a sapphire substrate can, for example, be cited.

Similarly, the bulk substrate of material $P_{iezo1}$ in which the thin layer of first piezoelectric material is produced can be replaced by a composite substrate composed of a host substrate (for example a suitable material for the temperature compensation of sapphire, silicon, quartz or similar type) onto which is transferred (by implantation/fracture or bonding/mechanical thinning) or deposited or applied by epitaxy, a layer of first piezoelectric material.

The invention claimed is:

1. An acoustic wave device, comprising:
   a substrate comprising a piezoelectric material;
   a first stack of layers on the substrate, the first stack of layers comprising at least one first metal layer over the substrate and a layer of a first monocrystalline piezoelectric material disposed completely on a surface of the at least one first metal layer
   a second metal layer disposed completely on a surface of the layer of the first monocrystalline piezoelectric material in the first stack, the first stack defining at least one bulk acoustic wave filter incorporating the first monocrystalline piezoelectric material; and
   a third metal layer over the substrate in a second area, wherein the first monocrystalline piezoelectric is absent in the second area, the second area defining at least one surface acoustic wave filter incorporating the piezoelectric material of the substrate.

2. The acoustic wave device according to claim 1, wherein the substrate consist of the piezoelectric material of the substrate.

3. The acoustic wave device according to claim 1, wherein the first monocrystalline piezoelectric material is one of $LiNbO_3$, $LiTaO_3$, $La_3Ga_5SiO_{14}$, and $La_3Ga_{5.5}Ta_{0.5}O_{14}$ type.

4. The acoustic wave device according to claim 1, wherein the piezoelectric material of the substrate is one of $LiNbO_3$, $LiTaO_3$, $La_3Ga_5SiO_{14}$, and $La_3Ga_{5.5}Ta_{0.5}O_{14}$ type.

5. The acoustic wave device according to claim 1, wherein the at least one first metal layer is one of metal of copper, copper and aluminium alloy, tungsten, molybdenum, AlSi, and Cr type.

6. The acoustic wave device according to claim 1, further comprising at least one molecular bonding layer between the at least one first metal layer and the piezoelectric material of the substrate, the at least one molecular bonding layer being of a low temperature oxide of $SiO_2$ type.

7. The acoustic wave device according to claim 1, wherein the substrate comprises a single layer of the piezoelectric material of the substrate.

8. The acoustic wave device according to claim 7, wherein the piezoelectric single layer material of the substrate is one of $SrTiO_3$, or $PbZrTiO_3$, or AlN, and ZnO type.

9. The acoustic wave device according to claim 7, wherein the substrate comprises sapphire, silicon, quartz, or glass.

10. The acoustic wave device according to claim 1, further comprising a decoupling layer on the piezoelectric material of the substrate and under the at least one first metal layer.

11. The acoustic wave device according to claim 10, wherein the decoupling layer is a layer of air.

12. The acoustic wave device according to claim 10, wherein the decoupling layer comprises a Bragg array structure.

13. The acoustic wave device according to claim 12, wherein the Bragg array comprises an alternation of layers of tungsten and silica.

14. A method for fabricating an acoustic wave device comprising at least one surface acoustic wave filter and at least one bulk acoustic wave filter, the method comprising:
    forming a first stack comprising at least one layer of piezoelectric material, a first metal layer disposed on a surface of the at least one layer of piezoelectric material, and a layer of a first monocrystalline piezoelectric material completely over the first metal layer by applying the layer of the first monocrystalline piezoelectric material covered by the first metal layer, on the at least one layer of piezoelectric material;
    forming a second area by partially etching said first stack so that the first monocrystalline piezoelectric material is absent;
    producing a second metal layer over the layer of the first monocrystalline piezoelectric material in the first stack, the first stack defining the at least one bulk acoustic wave filter incorporating the first monocrystalline piezoelectric material; and
    producing a third metal layer over the at least one layer of the at least one layer of piezoelectric material in the second area, the second area defining the at least one surface acoustic wave filter incorporating the at least one layer of piezoelectric material.

15. The method for fabricating the acoustic wave device according to claim 14, wherein the layer of the first monocrystalline piezoelectric material is applied completely over the first metal layer by:
    assembling a first substrate comprising at least one layer of the first monocrystalline piezoelectric material covered with a top layer of the first metal with the at least one layer of piezoelectric material; and
    thinning the first substrate by lapping or polishing to define a thin layer of the first monocrystalline piezoelectric material.

16. The method for fabricating the acoustic wave device according to claim 14, wherein the layer of the at least one layer of piezoelectric material comprises a superficial portion of a bulk substrate made of the at least one layer of piezoelectric material.

17. The method for fabricating the acoustic wave device according to claim 14, wherein the at least one layer of piezoelectric material is deposited or applied by epitaxy or surface-mounting.

18. The method for fabricating the acoustic wave device according to claim 14, wherein the layer of the first monocrystalline piezoelectric material is applied completely over the first metal layer by:
    defining a thin layer of the first monocrystalline piezoelectric material within a substrate of the first monocrystalline piezoelectric material that comprises a top layer of first metal layer that defines a first assembly;
    assembling said first assembly on the at least one layer of piezoelectric material; and
    separating said substrate of the first monocrystalline piezoelectric material from said thin layer of the first monocrystalline piezoelectric material.

19. The method for fabricating the acoustic wave device according to claim 18, wherein separating said substrate of the first monocrystalline piezoelectric material from said thin layer of the first monocrystalline piezoelectric material comprises heat treating the substrate of the first monocrystalline piezoelectric material.

20. The method for fabricating the acoustic wave device according to claim 18, wherein said first assembly on the at least one layer of piezoelectric material comprises molecular bonding said first assembly to the at least one layer of piezoelectric material.

21. The method for fabricating the acoustic wave device according to claim 18, wherein the first assembly comprises a first bonding layer, and the at least one layer of piezoelectric material is covered with a second bonding layer.

22. The method for fabricating the acoustic wave device according to claim 21, wherein the first assembly comprises a decoupling layer.

23. The method for fabricating the acoustic wave device according to claim 18, wherein defining the thin layer of the first monocrystalline piezoelectric material comprises:
    metallizing the substrate comprising the first monocrystalline piezoelectric material at least on a surface of the substrate; and
    implanting ions in said substrate to create, in the first monocrystalline piezoelectric material, a buried fragile area defining the thin layer of the first monocrystalline piezoelectric material.

24. The method for fabricating the acoustic wave device according to claim 23, wherein the ions are hydrogen ions or helium ions.

* * * * *